(12) United States Patent
Becker et al.

(10) Patent No.: US 6,351,113 B1
(45) Date of Patent: Feb. 26, 2002

(54) INTEGRATED SOFT STARTER FOR ELECTRIC MOTOR

(75) Inventors: James A. Becker, Grafton; Kurt von Eckroth, Oconomowoc; Christopher J. Wieloch, Brookfield, all of WI (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 09/481,930

(22) Filed: Jan. 12, 2000

Related U.S. Application Data (62) Division of application No. 09/267,052, filed on Mar. 12, 1999, now Pat. No. 6,087,800.

(51) Int. Cl.[7] ............................................. G01R 33/00
(52) U.S. Cl. ............................. 324/117 H; 324/207.2
(58) Field of Search ........................... 324/117 H, 127, 324/202, 207.2, 207.14; 318/430, 432, 778, 779, 784; 323/901

(56) References Cited

U.S. PATENT DOCUMENTS

| | | | |
|---|---|---|---|
| 4,059,798 A | 11/1977 | Dierker et al. | 324/127 |
| 4,327,416 A * | 4/1982 | Jerrim | 364/481 |
| 4,823,075 A | 4/1989 | Alley | 324/117 |
| 5,337,214 A | 8/1994 | Lindsey et al. | 361/709 |
| 6,175,229 B1 * | 1/2001 | Becker et al. | 324/117 H |

FOREIGN PATENT DOCUMENTS

FR  2 619 915 A1  8/1997  ............ 15/2

* cited by examiner

Primary Examiner—Safet Metjahic
Assistant Examiner—Etienne P LeRoux
(74) Attorney, Agent, or Firm—Timothy J. Ziolkowski (57) ABSTRACT

A solid state motor starter, commonly referred to as a soft starter, is constructed in a manner to be easily manufacturable while at the same time combining all the required components in a relatively small package. A solid state power switch is clamped between a pair of bus bars in an offset manner to accommodate a discrete switching relay mounted in an inverted manner between the line input and the bus bar in communication with the load outputs. When in a motor run mode, current is shunted away from the solid state power switching device and through the switching relay, a substantially linear current path is achieved to reduce power loss and heat buildup. The arrangement allows for a heat sink mounted to one of the bus bars with adequate spacing between the heat sink and the discrete relay for insertion of a cooling fan. Current sensing is achieved with a Hall effect sensor mounted to the bus bar in a small current sensing region that is created by having a pair of slots in the bus bar to direct current. A pair of magnetic pins extend perpendicular from the bus bar to create the magnetic flux for the Hall effect sensor to sense current flow through the current sensing region. The Hall effect sensor circuit board also contains a thermistor which is mounted with adequate insulation yet in thermal communication with the bus bar.

22 Claims, 9 Drawing Sheets

INTEGRATED SOFT STARTER FOR ELECTRIC MOTOR

This is a Divisional of Ser. No. 09/267,052, filed Mar. 12, 1999, now U.S. Pat. No. 6,087,800.

BACKGROUND OF THE INVENTION

Solid state motor starters, commonly referred to as "soft starters," control the starting and stopping of electrical motors with gated semiconductor devices such as SCRs, thyristors, or generally, solid state power switches. The present invention relates generally motor starters, and more particularly, to a compact solid state motor starter designed to reduce space requirements and be integrally combined in one complete small package.

Industry standard soft starter structural arrangement typically consists of several separate discrete component groups. Such groups include controllers, bypass contactors, sensors, overload protection, snubbers, cooling fans, power semiconductors, power bus bars, insulators, assembly hardware and mounting plates. When assembled as a unit, these prior art motor starters are quite large and cumbersome.

The controllers are usually housed in Class II enclosures with discrete screw type terminal blocks and mounting feet. The size and power requirements of the controller may vary depending on the application and sophistication of the control. The controller package is often broken up into several separate printed circuit board assemblies requiring interconnects and mounting.

Discrete bypass contactors are used to shunt the power semiconductors after the motor has reached its running speed. The bypass contactors require mounting hardware, coil leads with terminations, and power conductors from the line and load side of the soft starter.

Soft starters may have several different types of sensors. The most basic sensor typically found in a soft starter, is the current sensor, which is typically a rather bulky configuration. Some of the most common methods for sensing current include a large current transformer with matching current meter and with rather cumbersome mounting brackets. Another method includes a ferrite toroid with a matching current meter or printed circuit board assembly, and also requiring a bulky and cumbersome mounting arrangement. Yet another method includes a Rogowski coil and matching circuit board assembly, also requiring bulky mounting brackets.

In further detail, the most common industrial practice is to measure current using the same principles as a transformer. A magnetic field is induced around a conductor as current is passed through the conductor. This magnetic field is induced into a magnetic core. The core material can range from being a very good magnetic material, for example ferrous magnetic iron or steel, or it can include a very weak magnetic material, such as air. A second coil is also required, and is looped around the magnetic coil material, or around the current carrying member. The amount of magnetically induced current into the second coil is dependent on the reluctance of the core material used, and the amount of signal current desired. The current signal therefore should be proportional to the actual current in the conductor of interest. A scale is developed to read the coupled current signal value in the conductor as an actual current signal. The meter used is typically a current meter. However, if the second coil circuit has many turns of small gauge wire, the coupled signal has a low current value, and therefore a volt meter can alternatively be used. The following description describes in further detail some of the most common methods presently used to accomplish such current sensing. The output of the second coil may alternatively be used to drive an overload relay.

Perhaps the most common method to measure current using the principles of a transformer, is to encircle the conductor with a wire forming a number of loops, and measuring the current inductively induced in that wire. This method is similar to an air core transformer and is commonly referred to as a current transformer. Another method is to encircle a conductor with a rigid piece of ferrite core material having good magnetic reluctance and then wind the ferrite material with wire loops and measure the inductively induced current. This method is similar to an air iron core transformer and is commonly referred to as simply a toroid.

Similarly, a core, constructed of several laminations, can be positioned around a conductor with wire coiled around one portion of the lamination loop to measure the inductively induced current in the coil, which is also similar to an iron core transformer. In order to assist assembly, a variation of this scheme was developed in which a lamination core is split so that the conductor to be monitored does not have to be passed through the core before it can be properly positioned. The core is then opened about the lamination split, the conductor of interest is inserted into the core at the desired position, and the core can then be closed to maintain the low reluctance of the magnetic loop. Yet another method is to use thin steel laminations as a ferrite core material, and then wind the ferrite material with wire loops. Since the core area is small and the wire gauge is thin, the inductively induced voltage can then be measured. This method is similar to an iron core transformer and is referred to as a Rogowski coil.

All of the aforementioned current measuring techniques discussed and typically used in soft starters have one common physical limitation that is a major disadvantage in constructing a compact motor starter. That common disadvantage is that the second coil, or the ferrite core, used to develop the induced current or voltage signal must be positioned about the periphery of the conductor of interest. Since motor starters require relatively large conductors, any additional material about the conductors results in excessively large packaging of the motor starters. Further, in any three phase motor starter which has three separate conductors that must be monitored, the potential for cross-talk, or interference, between the current sensors becomes quite high.

Soft starters may also require thermal monitoring to protect the power semiconductors. One common method for thermal protection includes a bi-metal disk or "Popit" requiring mounting brackets, hardware, and electrical insulation depending where it is located with respect to the current carrying members of the soft starter. In operation, when the bi-metal disk reaches the trip temperature, the bi-metal disk snaps into the stressed position and changes the state of the electrical contacts, thereby signaling to the control circuit that a temperature limit has been reached. However, bi-metal disks respond very slowly to temperature changes because of their large inherent material mass and have a very narrow temperature range. If monitoring of several temperature ranges were required, a separate bi-metal disk would be required for each temperature range. Another type of thermal protection uses infrared heat sensors. Although these devices do not require placement on a current carrying member, they must be in close proximity to it. Therefore, mounting brackets and a matching circuit board assembly is required and the sensor must be "aimed"

at the component to be monitored. Heat sensitive resistors, or thermistors, can also be used to measure the temperature of electrical components. Heat sensitive resistors change resistance with temperature change. The change in resistance is then calibrated to a voltage, which in turn is used as a temperature reference and indicates the temperature of the component. Thermistors respond very quickly to temperature changes because of their small inherent material mass.

Bi-metal disks and thermistors are usually located near or on current carrying members in electrical equipment. They both require discrete electrical leads or terminals that require routing and termination. Prior art use of these devices has also required separate mounting fasteners or brackets. Additional electrical insulation or barriers are then required to protect these devices from the line potential of the current carrying members. Since these devices are typically mounted individually, they then require additional space in the piece of electrical equipment to be monitored, which therefore increases the size of the equipment.

Soft starters also require a snubber assembly, which typically includes a resistor and a capacitor in series to protect the power semiconductor components from transient noise. The snubber assembly is connected across the line and load terminals of the motor starter, and have discrete leads. These devices also require mounting brackets and associated hardware.

Where natural convection is not sufficient to cool the motor starter, a cooling fan is necessary to provide forced air. The cooling fan normally increases the size of the enclosure, or is mounted externally and vents the starter through a vent in the package. In either case, the cooling fan oftentimes adds considerable size to the overall package.

Soft starters also include overload protection which is required on all power control equipment and can be accomplished by using overload relays or an overload circuit board assembly. Typically, when the current being measured reaches a preset limit, the overload changes state and disconnects the motor from the power source. The overload can be a discrete device or an integral function of the controller. Such devices usually have a limited range and are very application sensitive with respect to motor current.

Soft starters use discrete semiconductors or SCR "pucks." Depending on power requirements, such devices can become rather large and add to packaging complexity and increase the size significantly. In multi-phase applications, where multiple power conductors are required, physical spacing between poles is dependent on the operating voltage. The size of the conductors is also proportional to the amount of in-rush current that must be carried and the amount of heat that must be removed from the power semiconductors.

All the aforementioned components of the soft starter are usually mounted to a single mounting panel that results in a quite large overall package. Such prior art soft starters assembled in this manner, require excessive production assembly time, have excessive volume and mass associated with it, and have an enclosure that is exceedingly too large.

SUMMARY OF THE INVENTION

The present invention offers a solid state motor starter that solves the aforementioned problems and provides a soft starter assembly that integrates the aforementioned components into a relatively small package resulting in reduced wall or floor space requirements, while simultaneously providing an easily manufacturable motor starter.

In accordance with one aspect of the invention, a solid state motor starter includes a first electrically conducting bus bar adapted to receive an external current carrying conductor from a power source at a line input end, and a second electrically conducting bus bar adapted to receive an external current carrying conductor connectable to a motor at a load output end. There is at least one solid state power switching device clamped between the first and second electrically conducting bus bars, and a discrete electromagnetic power switching relay having an electrical input and an electrical output forming a bypass current path around the solid state power switch's device. The electrical input is connectable to the external current carrying conductor from the power source, and the electrical output is connected to the second electrically conducting bus bar in shunt of the solid state power switching device. The discrete electromagnetic switching relay is mounted such that the relay current path is in linear relation (i.e., in a straight line) with the second electrically conducting bus bar, thereby providing a linear current path through the solid state motor starter when the discrete electromagnetic switching relay is switched to relay power from the power source to the motor, which reduces heat build-up in the soft starter.

Additionally, in accordance with another aspect of the invention, the discrete electromagnetic switching relay of the motor starter is mounted rearwardly of the second electrically conducting bus bar and is optimally fitted in an inverted arrangement such that its internal contacts are in close relation to the first electrically conducting bus bar and its internal magnet is spaced furthest from the first electrically conducting bus bar. The motor starter also includes a heat sink mounted to the second electrically conducting bus bar in a spaced relation to the discrete electromagnetic switching relay so as to provide for a cooling fan mounted between the heat sink and the discrete electromagnetic switching relay to force air flow across the heat sink for additional cooling. Additionally, the large mass of the second electrically conducting bus bar serves as a heat sink when solid state power switching device is conducting.

A cover assembly is molded to fit over the solid state motor starter and has a heat sink tunnel to accommodate the cooling fan and the heat sink. A thermistor is mounted in the cover assembly to sense air flow temperature across the heat sink. A current sensor and thermistor assembly is attached directly to one of the electrically conducting bus bars which is modified to provide a relatively small current sensing region by cutting a pair of slots from the outer edges toward a central area of the bus bar. Current sensing can then be accomplished using a very small Hall effect sensor, as opposed to the prior art methods for current sensing for such large bus bars. Additionally, a common circuit board is used for the Hall effect sensor and a thermistor which is mounted to monitor heat buildup across the current sensing region.

In accordance with another aspect of the invention, a solid state motor starter having two distinct current paths therein and constructed in a relatively compact small package includes a first current path structure defined by a power supply input connected to a first bus bar which is in electrical communication with a pair of solid state power switches for completing electrical connection with a second bus bar when at least one of the solid state power switches is switched to an ON state to ramp-up power to a motor connectable to the second bus bar during motor startup and to ramp-down power to the motor during motor shutdown. A second current path structure is operable during a motor run mode and defined by the power supply input connected to an input of an inverted electromagnetic relay switchable between a current conducting mode and a current non-conducting mode. When the electromagnetic relay is in a current conducting mode, and the solid state motor starter is therefore in the motor run mode, the second current path is further defined by an electrical connection between an output of the electromagnetic relay and the second bus bar connectable to the motor. The second current path is advantageously a substantially linear current path across the motor starter which reduces not only power loss, but also minimizes heat buildup while in the motor run mode.

In accordance with yet another aspect of the invention, a current sensor assembly for use in a large surface electrically conducting bus bar includes a bus bar having therein a relatively narrow current path formed by a pair of slots, each slot extending from an outer edge of the bus bar inwardly to the relatively narrow current path. The pair of slots creates the relatively narrow current path in the direction of current flow. A pair of magnetic pins extending through the bus bar transversely to an electrical current path at an outer periphery of the relatively narrow current path. The magnetic pins are spaced apart to create a magnetic flux path between the pair of magnetic pins. The magnetic pins do not create magnetic flux per se, but concentrates the magnetic flux between the magnetic pins. Therefore, a magnetic flux path is created between the magnetic pins. Preferably, the relatively narrow current path is at or near the center of the bus bar to avoid interference from magnetic flux from neighboring bus bars. In some applications, it may be preferable to offset the narrow current path from center to further distance the magnetic flux path created between the magnetic pins. A Hall effect sensor is located between the magnetic pins and above the relatively narrow current path and within the magnetic flux path created by the pair of magnetic pins. Additionally, the Hall effect sensor is mounted on a circuit board together with a thermistor for monitoring the temperature of the bus bar in the current sensing region.

Various other features, objects and advantages of the present invention will be made apparent from the following detailed description and the drawings.

BRIEF DESCRIPTION OF THE DRAWINGS

The drawings illustrate the best mode presently contemplated for carrying out the invention.

In the drawings.

DETAILED DESCRIPTION OF THE PREFERRED EMBODIMENT

Figure 1:
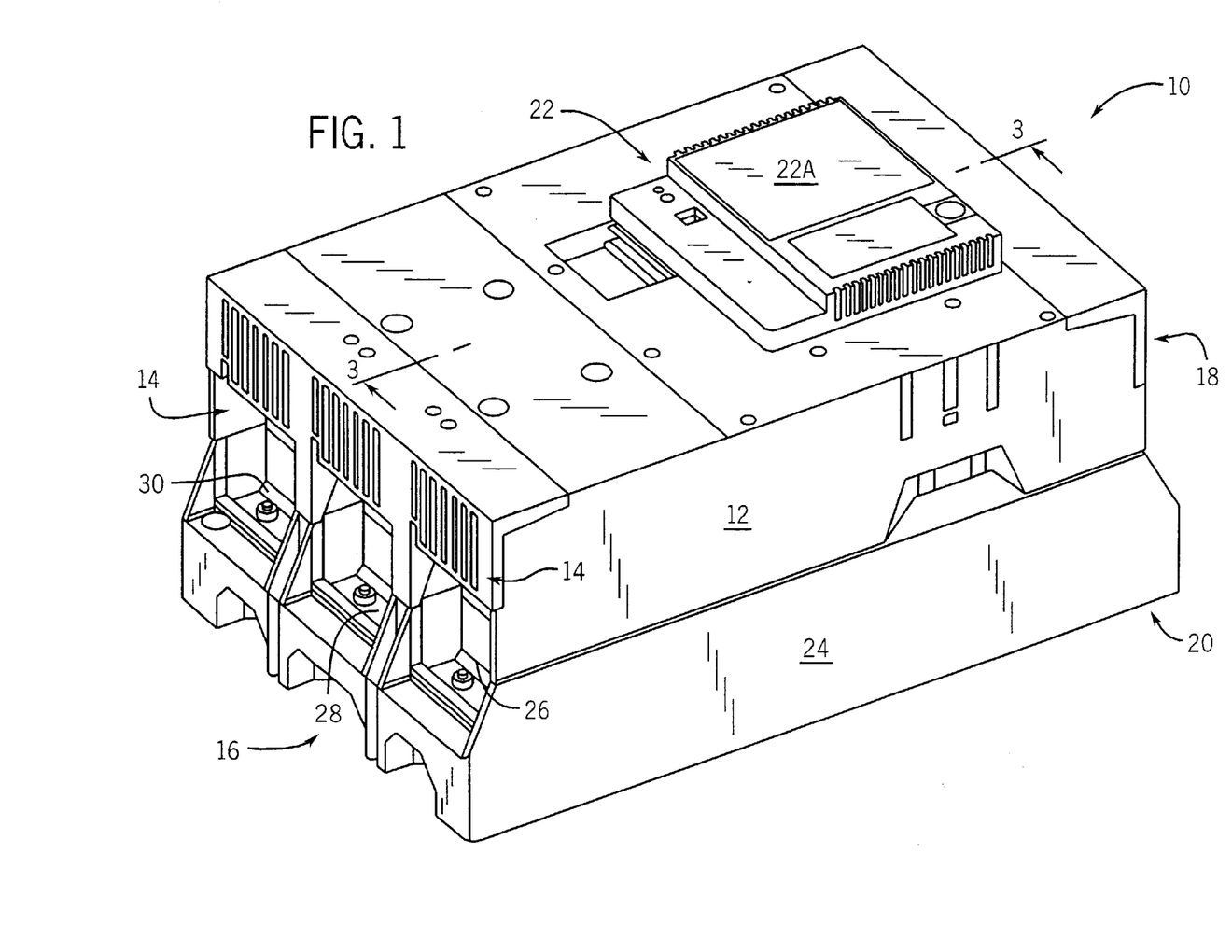
FIG. 1 is a perspective view of a motor starter according to the present invention.

Referring to the drawings, FIG. 1 shows a three phase, three-pole solid state motor starter 10, also known as a soft motor starter. The motor starter 10 includes a cover assembly 12 having air inlets 14 on a motor connection end, or load end 16. Similar air outlets 18 are located on a power source end, or line end 20 of the motor starter 10. The cover assembly 12 also houses an electronic controller circuit 22 protected by a circuit cover 22A. The controller circuit 22 is not an element of this invention and will not be further described. The motor starter 10 also includes a base assembly 24 to house each of three power pole assemblies 26, 28, and 30. Each of the power pole assemblies 26, 28, and 30 are identical in construction for a given motor starter 10, and as such, this disclosure will describe only one of the power pole assemblies 28 in further detail hereinafter.

Figure 2:
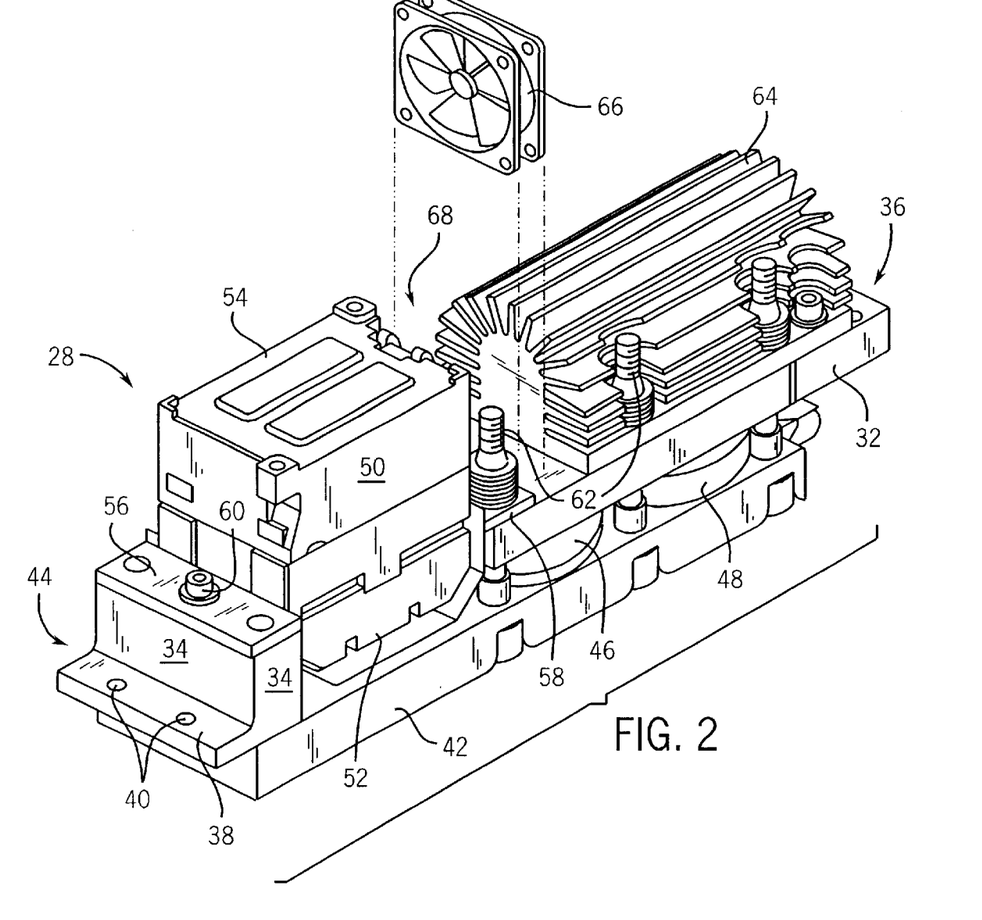
FIG. 2 is a perspective view of a portion of FIG. 1.

FIG. 2 is a perspective view of a single power pole assembly, for example, that of power pole assembly 28 of the motor starter 10. Power pole assembly 28 includes a first electrically conducting bus bar 32 that is adapted to receive a wiring lug connector (not shown) which in turn receives an external current carrying conductor from a power source (not shown) at an input end 36. An L-shaped conductor 34 has a flange 38 having a pair of bolt holes 40 for mounting the power pole assembly 28 to the base assembly 24, FIG. 1, at the load end 16. Referring back to FIG. 2, the power pole assembly 28 of the motor starter 10 has a second electrically conducting bus bar 42 mechanically and electrically connected to the L-shaped conductor 34 to receive a wiring lug connector (not shown) to connect the pole assembly 28 to an external current carrying conductor (not shown) connectable to a motor (not shown) at a power output end 44. In a preferred embodiment, a pair of solid state power switching devices 46 and 48, such as SCRs, are clamped between the first and second electrically conducting bus bars 32 and 42. Depending upon the power requirements of the motor to be driven by the motor starter 10, the bus bars can be larger or smaller. Further, an alternate embodiment may use solid state switching devices, other than SCR's, depending upon switching characteristics required and overall power requirements.

A discrete electromagnetic switching relay 50 is mounted in the power pole assembly 28 in an inverted manner such that the internal contacts are facing downwardly at a lower end 52, and the internal magnet and stater are at an upper end 54. The switching relay 50 has a pair of stationary contacts 56 and 58. The output stationary contact 56 is connected to the L-shaped conductor 34 with at least one mounting bolt 60. The input stationary contact 58 is attached to the first bus bar 32 by two of six clamping bolts 62. By mounting the switching relay in an inverted manner as shown, in the structure of the present invention, a substantially linear current path through the power pole assembly 28 is achieved for operation in a motor run mode, as will later be described.

The internal construction of the discrete electromagnetic switching relay 50 can be of standard construction. An example of such a relay is disclosed in U.S. Pat. No. 5,337,214 issued to Lindsey et al. on Aug. 9, 1994 and assigned to the Assignee of this invention. However, as one skilled in the art will readily recognize, the contacts 56 and 58 of the present invention, extend outwardly from opposite sides, whereas the contacts of the relay disclosed in U.S. Pat. No. 5,337,214 extend outwardly from the same side. One skilled in the art will readily recognize that such contact location is achievable with minor housing and structure modifications.

The power pole assembly 28 of FIG. 2 also has a heat sink 64 mounted on the first electrically conductive bus bar 32. The heat sink 64 is spaced away from the discrete electromagnetic switching relay 50 to allow insertion and mounting of a cooling fan 66 therebetween. The cooling fan 66 is supported by the cover assembly 12, FIG. 1. In a preferred embodiment, each of the power pole assemblies 26, 28, and 30, each has its own cooling fan 66 mounted within cover 12 and engageable in space 68 of each of the power pole assemblies 26, 28 and 30.

In operation, each power pole assembly 26, 28, and 30 of the motor starter 10 have two distinct current paths. A first current path structure, operable during a motor start-up mode and a motor shut-down mode is defined by a power supply (not shown) connected to provide power to the first bus bar 32. The first current path structure is further defined to include the solid state power switches 46 and 48 for completing electrical connection with the second bus bar 42 when at least one of the solid state power switches 46, 48 is switched to an ON state to ramp-up power to a motor (not shown) connectable through the L-shaped conductor 34 to the second bus bar 42 during motor start-up, and to ramp-down power to the motor during motor shut-down. A second current path structure is operable during a motor run mode, which is initiated only after the motor has been ramped up to speed. The second current path structure is defined by the power supply connected to the input stationary contact 58 of the inverted electromagnetic relay 50 through the first bus bar 32. The relay 50 is switchable between a current conducting mode and a current non-conducting mode. When the motor is being ramped-up or ramped-down, the switchable relay 50 is in a non-conducting mode, and therefore, the second current path is interrupted by the switching relay 50. However, when the electromagnetic switching relay 50 is in a current conducting mode and the motor starter 10 is therefore in the motor run mode, the second current path is completed, and power is supplied to the output stationary contact 56 which is connectable to the motor. Once a motor is ramped-up to speed using the SCRs 46 and 48 in the first current path, the switchable contactor relay 50 is energized to bypass, or shunt, current from the SCRs, at which time the SCRs can be turned OFF. In this manner, the contact elements in contactor relay 50 are preserved by not experiencing the normal arcing which would occur otherwise. Similarly, to shut OFF a motor, the SCRs 46 and 48 are turned back ON nearly simultaneously with de-energizing relay 50 so that there is virtually no arcing within the relay 50. The SCRs can then ramp-down the motor.

As can be seen from FIG. 2, the second current path structure provides a substantially linear current path from the first bus bar 32, through the input stationary contact 58, through relay 50, and through the output stationary contact 56. Such a linear current path not only reduces power loss during the motor run mode, it also minimizes heat build-up in the motor starter. Additionally, the unique configuration provides a compact structure saving valuable floor or wall space in application.

Figure 3:
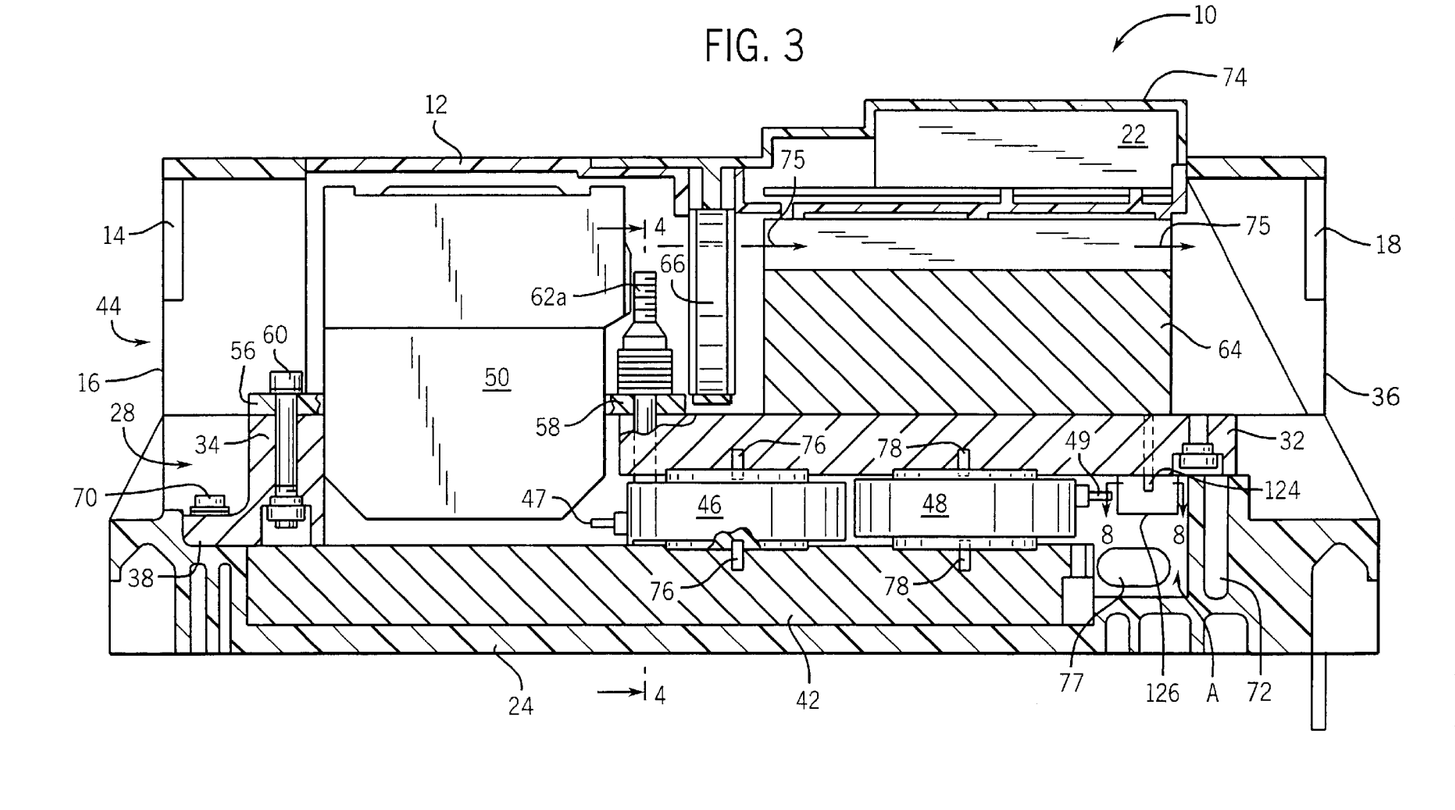
FIG. 3 is a sectional side view taken generally about line 3—3 of FIG. 1.

FIG. 3, shows a cross-section of the solid state motor starter 10 of FIG. 1, taken generally along line 3—3 of FIG. 1. The power pole assembly 28 is mounted in the base assembly 24 with a set of mounting bolts 70. Two of the mounting bolts 70 are located in the flange 38 of the L-shaped conductor 34 on the load output end 16. Another set of mounting bolts (not shown) fasten the power pole assembly 28 to the base 24 at the line inlet end 36 through the second bus bar 42 into bores 72, for example. The cooling fan 66 mounted to the cover assembly 12 is positioned between the inverted relay 50 and the heat sink 64 and directs air flow along lines 75 and out air outlets 18. Cover assembly 12 also includes a circuit board sub-housing 74 for mounting of the electronic controller circuit 22. The pair of solid state power switching devices 46 and 48 have input leads 47 and 49, respectively, which are connectable to the electronic controller circuit 22. Each of the switching devices 46 and 48 are held in place between the first bus bar 32 and the second bus bar 42, with a pair of roll pins 76 and 78, respectively, and clamped between the bus bars 32 and 42 with a set of clamping bolts 62.

In the available space provided in area A, a current sensor and thermistor assembly 126 is attached to the lower side of the first electrically conducting bus bar 32 for measuring current through the bus bar and sensing temperature of the bus bar, as will be further described with reference to FIGS. 8–11. Space A is also utilized by the placement of a snubber circuit 77 for electrical noise reduction and transient protection purposes. The snubber leads are connected to the line and load connectors as is commonly known.

Figure 4:
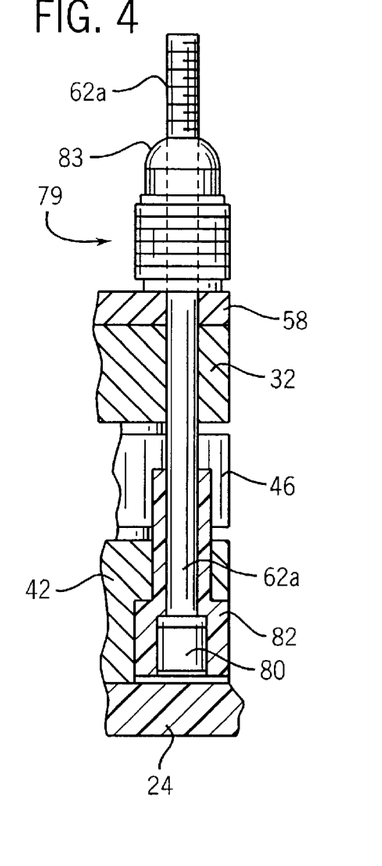
FIG. 4 is an enlarged detailed sectional view of a portion of FIG. 3 taken along line 4—4.
Figure 7:
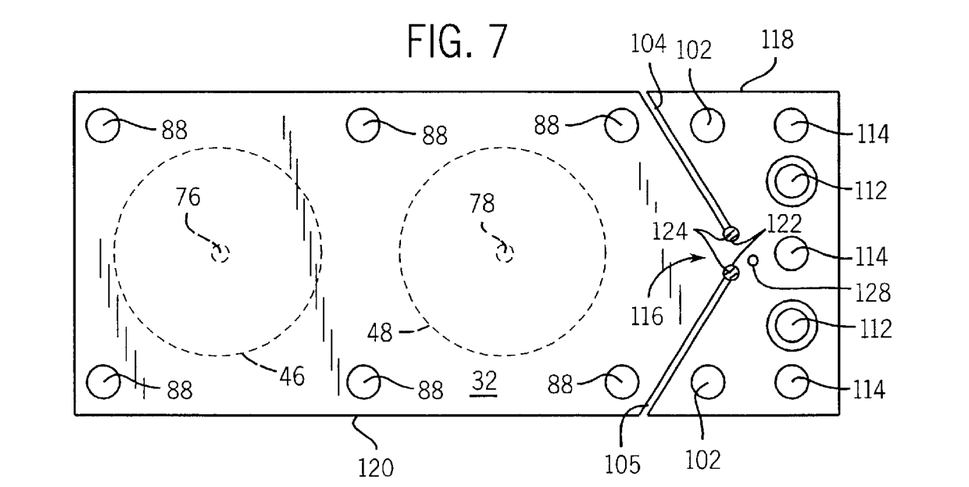
FIG. 7 is an enlarged plan view of a portion of FIG. 6.

FIG. 4 shows an enlarged detailed view of a clamping bolt 62a taken along line 4—4 of FIG. 3. The clamping bolt arrangement shown in FIG. 4 is exemplary of each of the six clamping bolts, three of which are shown in FIG. 2 assembled, and all of which are shown in FIG. 7 unassembled. Referring back to FIG. 4, the clamping bolt 62a clamps the solid state power switching device 46 between the first bus bar 32 and the second bus bar 42. A series of Belleville washers 79 are used with the clamping bolts and are compressed with a fastening nut 83. Clamping bolt 62a has an Allen head 80 engaged in an insulator 82 for insulating the second bus bar 42 from the first bus bar 32.

Figure 5:
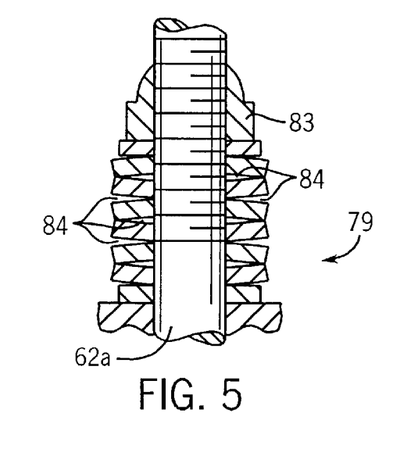
FIG. 5 is an enlarged cross-section of a portion of FIG. 4.

FIG. 5 shows an enlarged cross-section of a portion of the clamping bolt 62a, the Belleville washers 79 and the fastening nut 83 of FIG. 4. As indicated, the series of Belleville washers 79 include opposing concave and convex biased washers having small gaps 84 therebetween to allow contraction and expansion of the bus bars 32 and 42 during various operating modes, thereby maintaining a pressure on the devices 46, 48.

Figure 6:
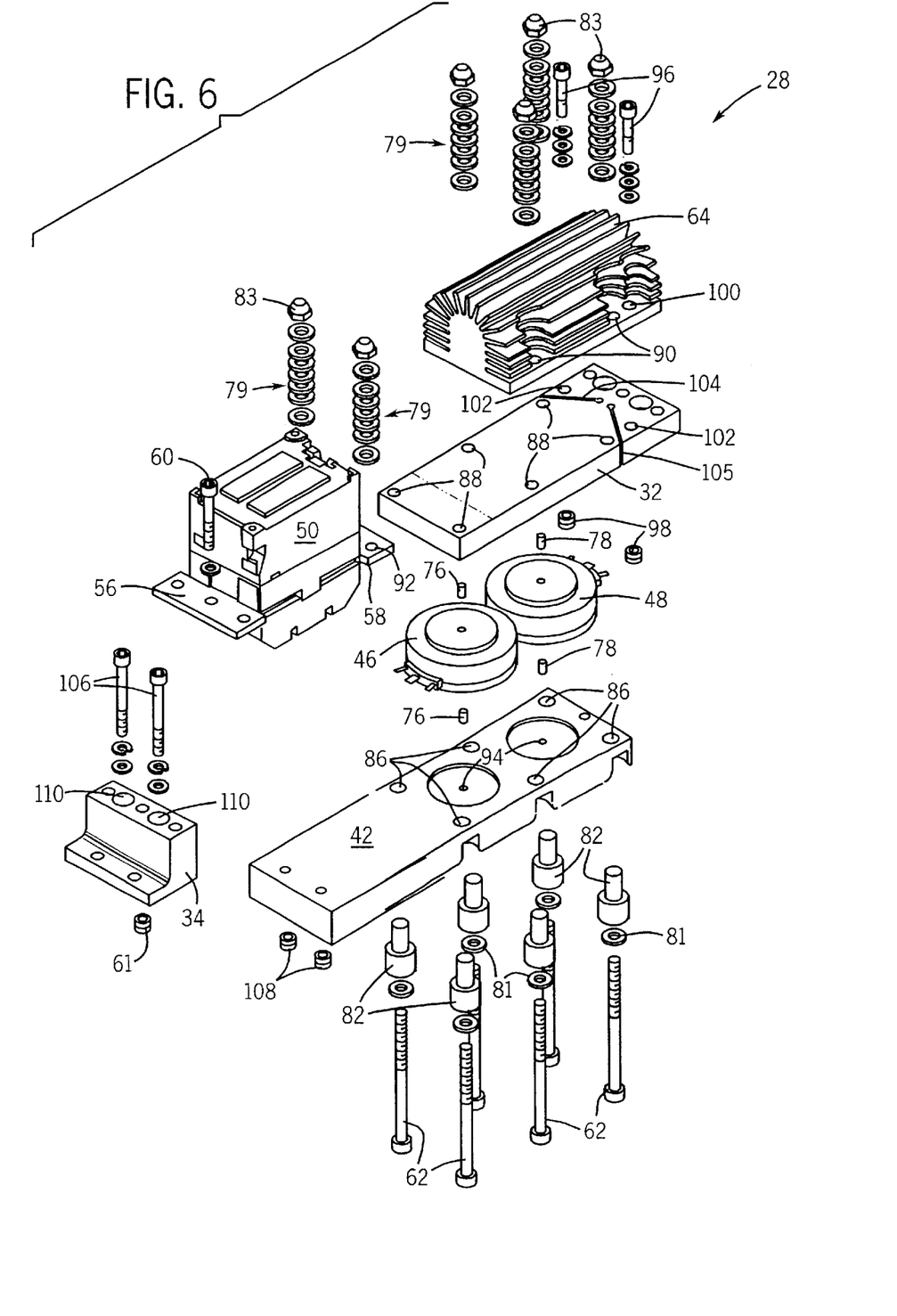
FIG. 6 is an exploded perspective view of the structure of FIG. 2.

Referring to FIG. 6, an exploded perspective view of the power pole assembly 28 of FIG. 2 is shown. As indicated, in the preferred embodiment, six clamping bolts 62 are used, along with six washers 81, and six insulators 82. The clamping bolts 62 extend through clamping holes 86 of the second bus bar 42, through the clamping holes 88 of the first bus bar 32, and through four clamping holes 90 of the heat sink 64. The relay 50 is also mounted with Belleville washers 79 and clamping bolts 62 through holes 92 in the input stationary contact 58 to allow slight movement between the relay and the bus bar due to expansion and contraction. Each clamping bolt 62 is equipped with a corresponding set of Belleville washers 79 and a fastening nut 83 to clamp the power switching devices 46 and 48 between the first and second bus bars 32 and 42.

The power switching devices 46 and 48 are centered on roll pins 76 and 78, respectively, in the small diameter roll pin holes 94 of the first and second bus bars 32 and 42. The heat sink 64 is additionally mounted to the second bus bar 42 with bolts 96 and nuts 98 through mounting holes 100 in the heat sink 64, and through mounting holes 102, in the first bus bar 32, to provide additional support to the bus bar 42 to compensate for slots 104 and 105, which will be further explained with reference to FIG. 7. As earlier explained, relay 50 is attached at the input end 58 to the first bus bar 32 with the foremost clamping bolts 62 and fastening nuts 78. The other end of the relay 50, having the input stationary contact 56, is mounted to the L-shaped conductor 34 via bolt 60 and nut 61, which is counter-bored into the bottom side of the L-shaped conductor 34 to receive nut 61 therein. When installed, a connecting lug assembly bolts to the three holes shown. The L-shaped conductor 34 is bolted to the second bus bar 42 via bolts 106 and nuts 108. Mounting holes 110 are counter-bored to accommodate a flush mounting of bolts 106 therein.

Figure 11:
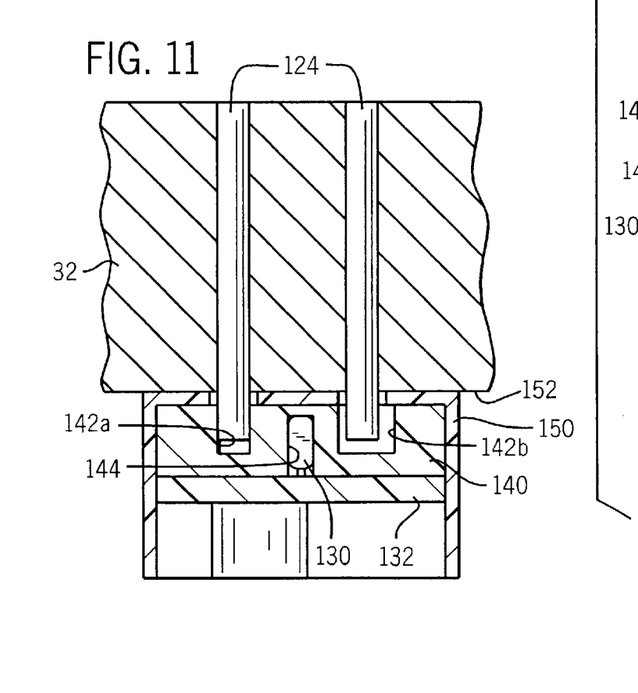
FIG. 11 is a side cross-sectional view of the structure of FIG. 10 taken along line 11—11.

FIG. 7 shows a top detailed view of the first electrically conducting bus bar 32. The SCRs 46 and 48 are shown in phantom mounted from underneath and centered about roll pins 76 and 78. The six left-most clamping holes 88 are for clamping the SCRs to the first bus bar as previously explained. Mounting holes 112 are counter-bored to mount the entire power pole assembly 28, FIG. 3, to the base assembly 24. The remaining holes 114 are used for attaching a wiring connector lug (not shown). Slots 104 and 105 are cut into the bus bar 42 to converge current passing through the first bus bar 32 within a relatively small, and preferably centered, current sensing region 116. Slots 104 and 105 extend inwardly from outer lateral edges 118 and 120, and converge inwardly toward a pair of pin bores 122. A pair of magnetic pins 124 are mounted in bores 122 and extend perpendicularly from the top surface of the bus bar 32. The pins 124, preferably of steel construction, are designed to concentrate and direct the magnetic flux created by the flow of current and the presence of the pins in the current path through the current sensing region 116. The pins 124 extend outwardly from the bus bar 32 at a desired height, as shown in FIGS. 3 and 11, wherein a current sensor and thermistor assembly 126 is attached thereover. Threaded hole 128, FIG. 7, is for mounting the current sensor and thermistor assembly to the first bus bar 32.

Figure 8:
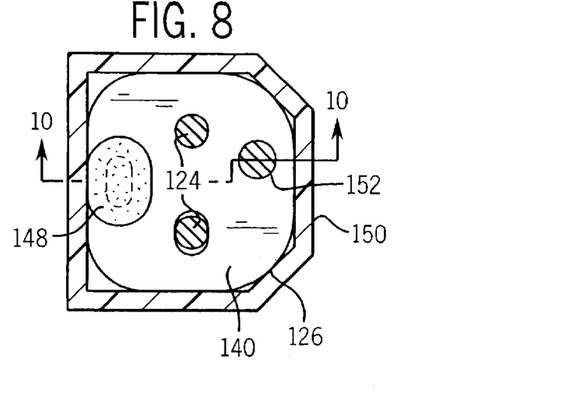
FIG. 8 is a top plan view of a portion of FIG. 3 taken along line 8—8.

FIG. 8 shows the current sensor and thermistor assembly 126 as taken along line 8—8 of FIG. 3. The steel pins 124 not only direct and concentrate the magnetic flux created by the current flow through the bus bar, but are also used for positioning the current sensor and thermistor assembly 126 to provide proper positioning of Hall effect sensor 130, as will be further described with reference to FIGS. 9–11.

Figure 9:
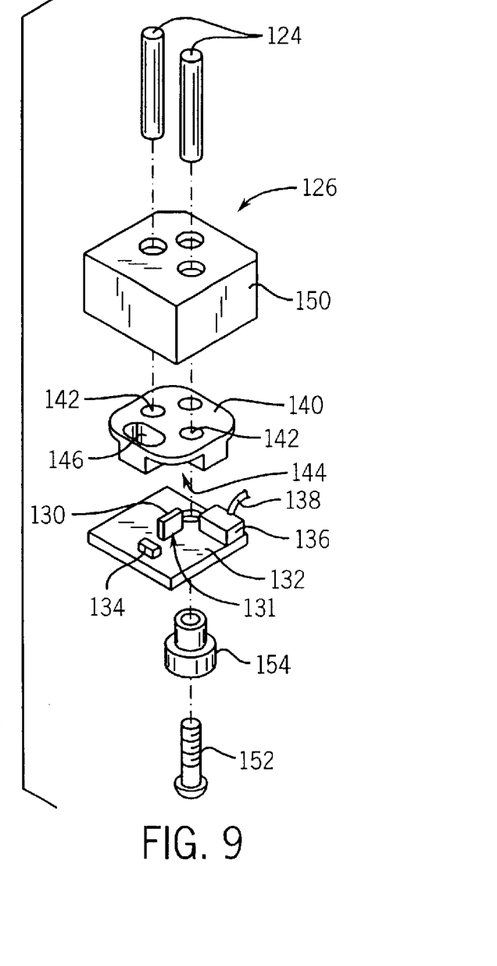
FIG. 9 is an exploded perspective view of the structure of FIG. 8.

Referring now to FIG. 9, the current sensor and thermistor assembly 126 is shown in exploded view about magnetic pins 124. The current sensor and thermistor assembly 126 includes a circuit board 132 having a Hall effect sensor 130 extending outwardly therefrom to sense current flow through the current sensing region 116, and thus through the entire bus bar 32. The Hall effect sensor 130 extends out perpendicular to the circuit board 132 such that a designated "sweet spot" 131 will ultimately be situated in the maximum flux path between the steel pins 124. The so-called "sweet spot" 131 is typically marked on a Hall effect sensor 130 to designate the most active region in a Hall effect sensor. Circuit board 132 also has a thermistor 134 to measure temperature on the bus bar. A lead connector 136 is soldered to the circuit board and a wiring harness 138 extends therefrom for connection to the controller circuit 22. The Hall effect sensor 130 and the thermistor 134 are connected as is customary. The current sensor and thermistor assembly 126 also has a positioning block 140 for receiving the circuit board 132 therein and properly positioning the Hall effect sensor 130 about pin holes 142 engageable with the pins 124 and into a Hall effect sensor slot 144 on the underside of the positioning block 140, as best viewed in FIGS. 10 and 11.

Figure 10:
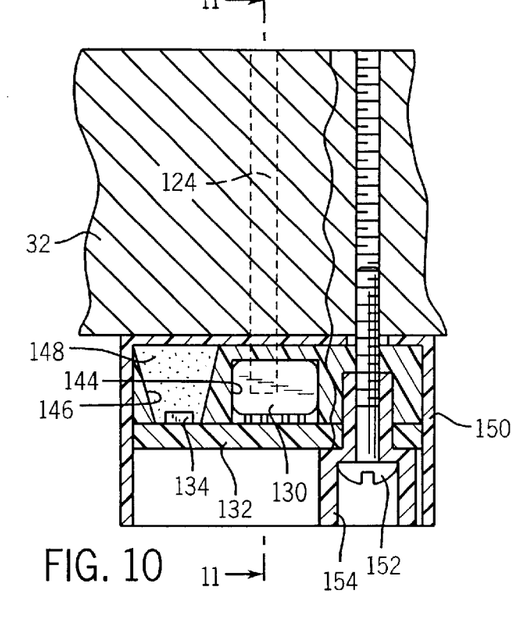
FIG. 10 is a cross-sectional view taken generally along line 10—10 of FIG. 8.

The positioning block 140 also has a frustoconical thermistor tunnel 146 to receive the thermistor 134 in the most narrow part of the tunnel, as best viewed in FIG. 10. The frustoconical thermistor tunnel 146 has its largest area in close proximity to the first bus bar 32 to sense the temperature of the bus bar in the current sensing region. The frustoconical thermistor tunnel has therein dispersed a thermally conductive paste 148 to ensure the conduction of heat from the surface of the bus bar 32 to the thermistor 134.

Referring back to FIG. 9, the current sensor and thermistor assembly 126 also includes an insulator, or isolator 150, which is designed to provide electrical isolation for the circuit board 132 and its components from the bus bar 32. The current sensor and thermistor assembly 126 is mounted to the bus bar with a non-magnetic screw 152 through an insulator 154, as also shown in FIG. 10.

Referring to FIG. 11, the circuit board 132 is shown with the Hall effect sensor 130 situated in the Hall effect sensor slot 144 of the positioning block 140. The positioning block has one pin hole 142a having a diameter of close proximity to that of the pins 124, and the other pin hole 142b, having a slightly oval shape to allow for any slight pin misalignment.

Since the motor starter 10, of the present invention has three power pole assemblies 26, 28, and 30, it is important to minimize any cross-talk among, or interference between, adjacent conductors that could effect the Hall device 130. In order to do so, the narrow current sensing region 116, FIG. 7, is centrally located from the outer lateral edges 118 and 120 of the first bus bar 32 which minimizes magnetic flux effects from adjacent bus bars. Further, by extending the magnetic pins 124 out from the surface 152 of the first bus bar 32 SO that the Hall effect sensor 144 intersects a maximum magnetic flux path caused by current flow perpendicular to pins 124, cross-talk between adjacent conductors is further minimized.

Referring back to FIG. 7, slots 104 and 105 are each angled rearwardly from the current sensing region 116 to the outer lateral edges 118 and 120 SO that the slots 104, 105 extend between a pair of mounting holes 88 and 102 of the first bus bar 32. Because the heat sink 64, FIG. 2 is mounted over the slots 104 and 105, FIG. 7, any structural weakening of the bus bar 32 is minimized by the strength of the heat sink 64, FIG. 2. It is noted that the slots 104 and 105 do not need to be angled to create the current sensing region 116, nor do they need to be the same length. However, the slots are angled and the same length in the preferred embodiment to position the current sensing region 116 centrally on the bus bar to minimize cross-talk and minimize any structural weakening caused by slots 104 and 105, as early described.

Figure 12:
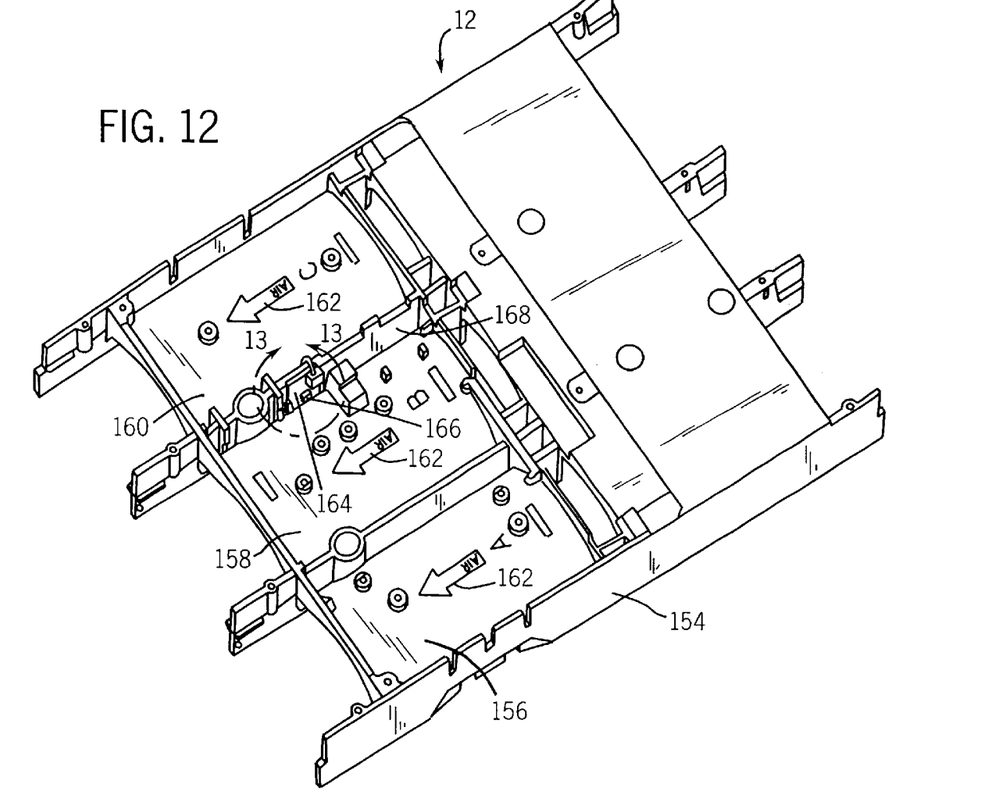
FIG. 12 is a perspective view of a portion of FIG. 1.
Figure 13:
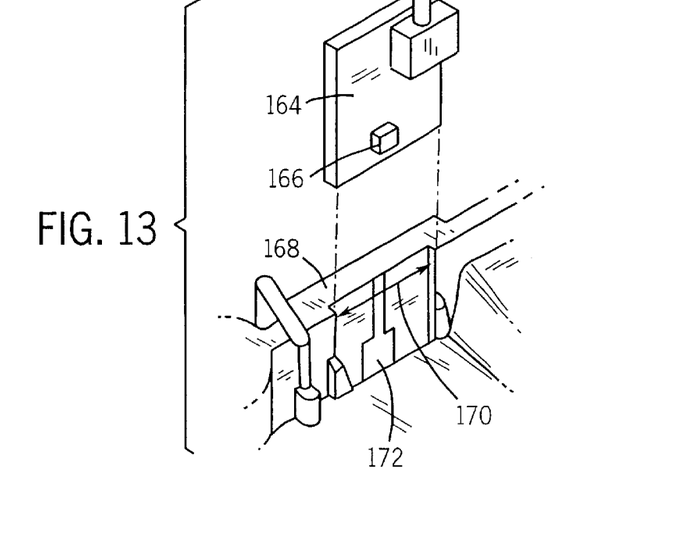
FIG. 13 is a detailed view of a portion of FIG. 12 taken along line 13—13.

Referring now to FIG. 12, a sub-housing 154 of the cover assembly 12 is shown with impressions 156, 158, and 160 to accommodate the heat sinks 64 of each of the power pole assemblies 26, 28 and 30, FIG. 1. The direction of air flow is indicated by arrows 162, FIG. 12. In order to monitor the air flow temperature inside the cover assembly 12, a circuit board 164 having a thermistor 166 is mounted between two of the impressions 158 and 160 on a lateral support 168, as best viewed in FIG. 13. The circuit board 164 fits within a friction-fit channel 170 within the lateral support 168. An air channel 172 provides direct air contact to thermistor 166 when the circuit board 164 is fully engaged into channel 170 of lateral support 168.

Figure 14:
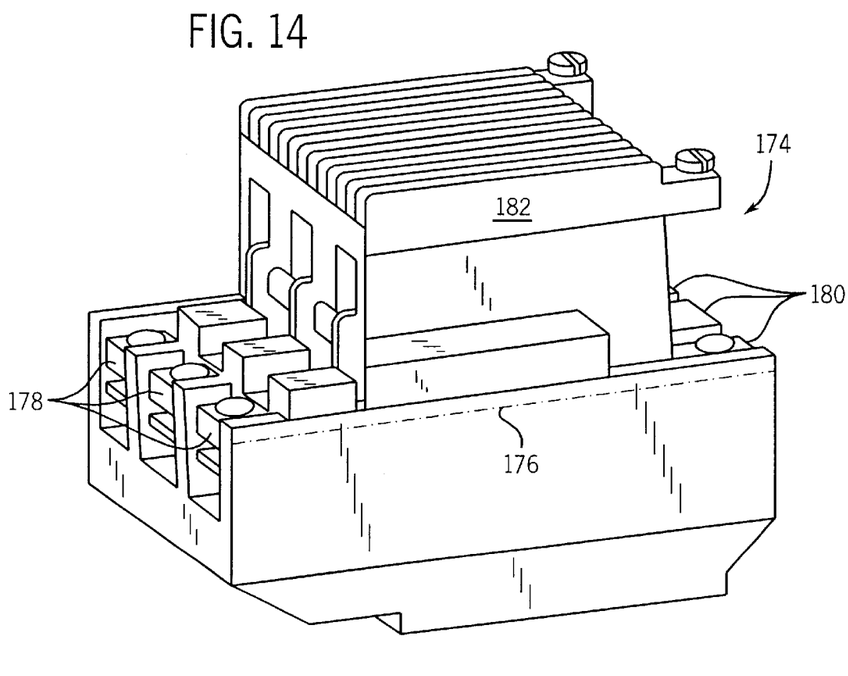
FIG. 14 is a perspective view of an alternate embodiment of a motor starter incorporating the present invention.

Referring to FIG. 14, an alternate embodiment of the invention is shown. A solid state motor starter 174 is shown with its outer enclosure removed. Motor starter 174 has a relatively short bypass power current path, which is substantially linear along line 176 commencing at the load lugs 178 and concluding at the line lugs 180. The motor starter 174, being of lower power handling requirements, uses internal phase-controlled thyristors as opposed to the larger hockey-puck SCRs shown in FIG. 1. A heat sink 182 is mounted directly to the motor starter 174.

Figure 15:
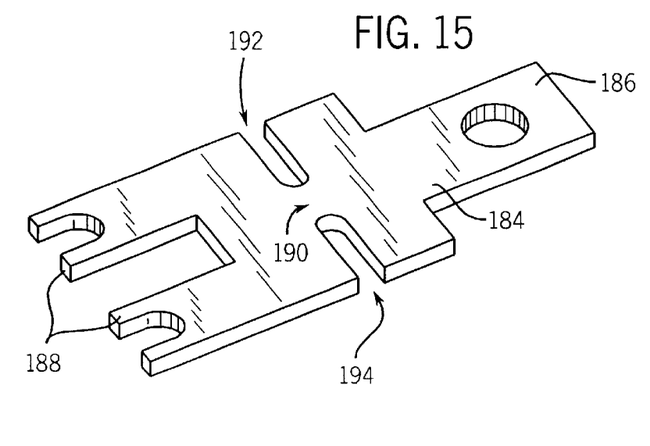
FIG. 15 is a perspective view of a bus bar used in the motor starter of FIG. 14.

FIG. 15 shows an alternate embodiment of a bus bar configuration 184 as used in the motor starter of FIG. 14. The bus bar 184 has a lug end 186 and contactor ends 188. In order to create a relatively small current sensing region 190, slots 192 and 194 are cut therein to force current flow through the current sensing region 190, similarly to that described with reference to bus bar 42 of FIG. 7. As indicated by a comparison of the slots 104 and 105 of FIG. 7, and the slots 192 and 194 of the bus bar 184 FIG. 15, the specific orientation of the slots is not critical, however, the size of the current sensing region is a function of current carrying requirements. The bus bar 184 of FIG. 15 can be similarly equipped with the current sensor and thermistor assembly 126 of FIG. 9. The length of the pins 124 would be adjusted to accommodate the thickness of the bus bar 184 so that the pins would be flush on one side and extend only enough to intersect the Hall effect sensor 130, as in FIG. 11.

Figure 16:
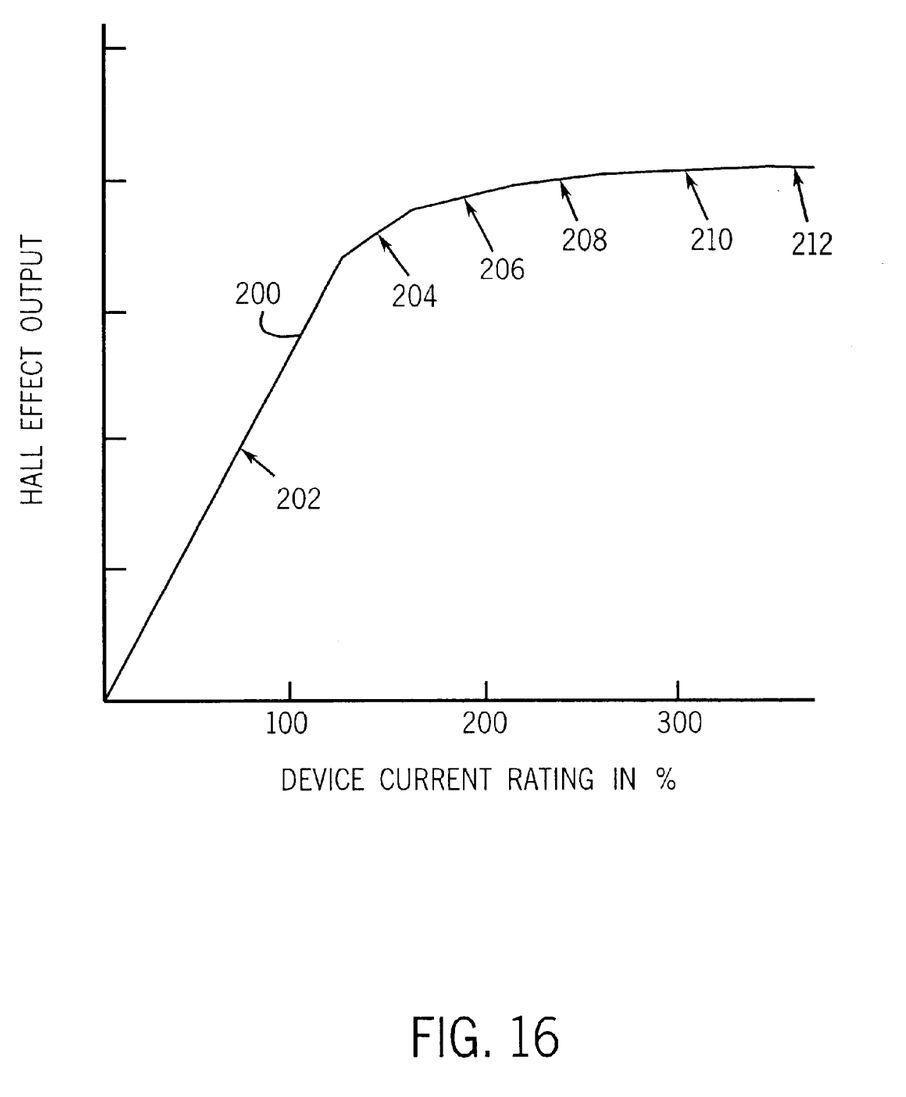
FIG. 16 is a graph of Hall effect output versus Hall. effect current rating in percentage.

Referring to FIG. 16, a desired characteristic curve 200 for the Hall effect current sensor is shown as a function of Hall effect output versus the soft starter current rating in percent. The figure shows that the present invention combines the linear and non-linear characteristics of using a Hall effect current sensor in measuring current. It is noted that the desired characteristics can be obtained by varying a number of factors. For example, by varying the width and shape of the restricted current sensing region 116, FIG. 7, and 190, FIG. 15, the characteristic curve can be modified as desired. Further, varying the type and amount of material of the magnetic pins 124 can also modify the permeance to obtain the desired characteristic curve. As an example, a hollow roll pin could be used in place of a solid steel pin of the same external diameter, but the hollow roll pin will have much less permeance, resulting in a completely different current characteristic curve.

The desired characteristics for the Hall effect sensor voltage output curve is to have an essentially linear portion 202 during the most critical portion, or active region, of the soft starter operating range. While within this range, current readings are obtained during the device's steady state operation and can be accurately compared to external measuring devices, the Hall effect output voltage should begin to drop off noticeably in an initial round-off stage 204 which is beyond the device's normal operating range. The initial round-off stage 204 is preferably at approximately 120%–130% of the device's rating, as the magnetic pins start to go into saturation. As the pins continue to saturate, a midrange round-off 206 occurs at approximately between 130%–150% of the linear current measurement range. The Hall effect device continues to respond to current increases by moving into the extended portion of the saturated pin round-off stage 208 to extend the current measurement range to approximately 300% of the device's linear current range. The final usable current measuring stage 210 occurs when the pins are saturated, and the curve has a very small slope. This stage extends the current range to approximately 600%, or six times the active linear portion of the current measurement range. Magnitude of the overload current is restricted by the Hall effect power supply. In the final stage 212, the Hall device current signal is hitting the power supply rail, therefore no further usable current measurement information is obtainable.

The present invention has been described in terms of the preferred embodiment, and it is recognized that equivalents, alternatives, and modifications, aside from those expressly stated, are possible and within the scope of the appending claims.

We claim:

1. In a large surface electrically conducting bus bar, a current sensor assembly comprising:

a bus bar having therein a relatively narrow current path formed by a pair of slots, each slot extending from an outer lateral edge of the bus bar inwardly to the relatively narrow current path, the pair of slots creating the relatively narrow current path in the direction of current flow;

a pair of magnetic pins extending through the bus bar at an outer periphery of the relatively narrow current path and spaced apart to create a magnetic flux path between the pair of magnetic pins; and a Hall effect sensor located between the magnetic pins and above the relatively narrow current path and within the magnetic flux path created by the pair of magnetic pins.

2. The current sensor assembly of claim 1 wherein the pair of magnetic pins extend out of the surface of the bus bar at a height selected by a proximity of the Hall effect sensor to the bus bar such that the Hall effect sensor is centralized within the magnetic flux path created between the pair of magnetic pins.

3. The current sensor assembly of claim 1 wherein the Hall effect sensor is mounted to a circuit board and further comprising an insulator positionable over the magnetic pins to receive the circuit board therein, the insulator having at least one opening to allow the magnetic pins to extend therethrough.

4. The current sensor assembly of claim 3 further comprising a positioner block having a pair of apertures sized to accommodate the magnetic pins firmly therein and having a thickness to space the circuit board a given distance from the bus bar such that the Hall effect sensor is positioned within the magnetic flux path.

5. The current sensor assembly of claim 4 wherein the positioner block further comprises a Hall effect sensor slot accurately to position the Hall effect sensor between the magnetic pins.

6. The current sensor assembly of claim 4 further comprising a non-magnetic screw and a insulator thereover to retain the circuit board to the bus bar with the insulator and positioner block therebetween.

7. The current sensor assembly of claim 4 further comprising a thermistor mounted on the circuit board and wherein the positioner block has a second aperture to receive the thermistor therein to sense bus bar temperature.

8. The current sensor assembly of claim 7 wherein the second aperture is frustoconical and is positioned with its larger opening facing the bus bar, and having a thermal conducting material in the frustoconical aperture between the bus bar and the thermistor.

9. The current sensor assembly of claim 1 wherein the bus bar has outer edges that are parallel to current flow and outer edges that are perpendicular to current flow and wherein the magnetic pins, and therefore, the relatively narrow current path, are located centrally in the bus bar with respect to the outer edges of the bus bar that are parallel with current flow in the bus bar.

10. The current sensor assembly of claim 9 wherein the thermistor provides bus bar temperature and a temperature compensation reading for the Hall effect sensor.

11. A method of obtaining current measurements in a large high power conducting bus bar comprising the steps of:

passing a current through a high power conducting bus bar;

creating a current restriction path for converging current in a relatively narrow current sensing region as compared to a width of the high power conducting bus bar;

producing a magnetic field within the narrow current sensing region; and aligning a Hall effect sensor within the magnetic field for generating an output signal proportional to the magnitude of the magnetic field.

12. The method of claim 11 wherein the step of producing a magnetic field is further defined as placing a pair of magnetic pins into the bus bar, perpendicular to current travel, and about an outer periphery of the current sensing region to direct a majority of magnetic flux through a magnetic flux path between the pair of magnetic pins.

13. The method of claim 12 further comprising the steps of extending the pair of magnetic pins above a surface of the bus bar and aligning the Hall effect sensor within the pair of magnetic pins such that the Hall effect sensor intersects a maximum magnetic flux path across the magnetic field.

14. The method of claim 11 further comprising the step of selecting a width and shape of the current sensing region to acquire a desired characteristic output from the Hall effect sensor.

15. The method of claim 12 further comprising the step of selecting a type and amount of material for the magnetic pins to acquire a desired characteristic output from the Hall effect sensor.

16. The method of claim 14 further comprising the step of acquiring a desired characteristic output from the Hall effect sensor such that a substantially linear output is achieved up to approximately 120%–130% of the Hall effect sensor's rating, and a usable non-linear response thereafter until the Hall effect sensor output hits a level equal to a power supply level of the Hall effect sensor.

17. The method of claim 11 wherein the step of creating a current restriction path is further defined as providing slots in the bus bar that are transverse to current flow to restrict current within a narrow path.

18. A sensor arrangement for use on a large surface electrically conducting bus bar comprising:

a thermistor mounted on a circuit board;

a positioner having a frustoconical tunnel to receive the thermistor in a narrow end of the frustoconical tunnel;

a thermal conductive material disbursed in the frustoconical tunnel of the positioner; and wherein a large end of the frustoconical opening is in close proximity to a surface to be monitored.

19. The sensor of claim 18 further comprising an isolation between the surface to be monitored and the positioner.

20. The sensor of claim 18 further comprising a current sensor on the circuit board with the thermistor to sense current in a same region of temperature sensing.

21. The sensor of claim 20 wherein the current sensor is a Hall effect device.

22. The sensor of claim 21 wherein the large surface electrically conducting bus bar has current directing channels therein to direct all current flow through an area that can be monitored by a Hall effect device.

* * * * *